(12) United States Patent
Kane

(10) Patent No.: US 6,472,681 B1
(45) Date of Patent: Oct. 29, 2002

(54) QUANTUM COMPUTER

(75) Inventor: Bruce Kane, Silver Spring, MD (US)

(73) Assignee: Unisearch Limited, Kensington (AU)

( * ) Notice: Subject to any disclaimer, the term of this patent is extended or adjusted under 35 U.S.C. 154(b) by 0 days.

(21) Appl. No.: 09/486,329
(22) PCT Filed: Sep. 17, 1998
(86) PCT No.: PCT/AU98/00777
§ 371 (c)(1),
(2), (4) Date: Jun. 23, 2000
(87) PCT Pub. No.: WO99/14858
PCT Pub. Date: Mar. 25, 1999

(30) Foreign Application Priority Data

Sep. 17, 1997 (AU) .............................................. PO9268

(51) Int. Cl.$^7$ .............................................. H01L 29/06
(52) U.S. Cl. ........................................... 257/14; 712/32
(58) Field of Search ............................... 257/14; 712/1, 712/37, 34

(56) References Cited

U.S. PATENT DOCUMENTS

| | | | |
|---|---|---|---|
| 5,530,263 A | | 6/1996 | DiVincenzo |
| 5,608,229 A | | 3/1997 | Mukai et al. |
| 5,671,437 A | | 9/1997 | Taira |
| 5,793,091 A | | 8/1998 | Devoe |
| 5,940,193 A | * | 8/1999 | Hotaling et al. ............... 359/11 |
| 6,081,119 A | * | 6/2000 | Carson et al. ............... 324/307 |
| 6,218,832 B1 | * | 4/2001 | Chuang et al. ............. 324/300 |

OTHER PUBLICATIONS

Kane, B., "A silicon–based nuclear spin quantum computer", Nature, vol. 393, pp. 133–137, May 14, 1998.

Chuang, I., et al., "Experimental realization of a quantum computer", Nature, vol. 393, pp. 143–146, May 14, 1998.

Kostychenko, V., "Spin–wave fluctuations in a quantum computer based on spin–polarized electrons", Russian Microelectronics, vol. 25, No. 5, pp. 327–328, 329.

Di Vincenzo, D., "Quantum computation", Science, vol. 270, pp. 255–261, Oct. 13, 1995.

Lloyd, S., "A potentially realizable quantum computer", Science, vol. 261, pp. 1569–1571, Sep. 17, 1993.

Feher G., "Electron spin resonance experiments on donors in silicon . . .", Physical Review, vol. 114, No. 5, pp. 1219–1244, Jun. 1, 1959.

Waugh, J. et al., "Mechanism of nuclear spin–lattice relaxation at very low temperatures", Physical Review, vol. 37, No. 8, pp. 4337–4339, Mar. 15, 1988.

* cited by examiner

Primary Examiner—Olik Chaudhuri
Assistant Examiner—Douglas A. Wille
(74) Attorney, Agent, or Firm—Wood, Phillips, Katz, Clark & Mortimer

(57) ABSTRACT

A quantum computer comprising a semiconductor substrate into which donor atoms are introduced to produce an array of donor nuclear spin electron systems having large electron wave functions at the nucleus of the donor atoms, where the donor electrons only occupy the nondegenerate lowest spin energy level. An insulating layer above the substrate. Conducting A-gates on the insulating layer above respective donor atoms to control strength of the hyperfine interactions between the donated electrons and the donor atoms' nuclear spins, and hence the resonance frequency of the nuclear spins of the donor atoms. Conducting J-gates on the Insulating layer between the A-gates to turn on and off electron mediated coupling between the nuclear spins or adjacent donor atoms. Where the nuclear spins of the donor atoms are the quantum states or "qubits" in which binary information is stored and manipulated by selective application of voltage to the A- and J-gates and selective application of an alternating magnetic field to the substrate.

23 Claims, 6 Drawing Sheets

QUANTUM COMPUTER

TECHNICAL FIELD

This invention concerns a quantum computer, that is a device for performing quantum computations. Recent progress in the theory of quantum computation, particularly the discovery of fast quantum algorithms, makes the development of such a device an important priority.

BACKGROUND ART

Finding an approach to quantum computation that fulfils the requirements has proved to be a formidable challenge. Nuclear spins have been incorporated into quantum computer proposals, because their lifetime can be at least six orders of magnitude greater than the time required to perform a logical operation on the spins.

SUMMARY OF THE INVENTION

The invention is a quantum computer, including:

A semiconductor substrate into which donor atoms are introduced to produce an array of donor nuclear spin electron systems having large electron wave functions at the nucleus of the donor atoms. Where the donor electrons (electrons weakly bound to the donor atom) only occupy the nondegenerate lowest spin energy level.

An insulating layer above the substrate.

Conducting A-gates on the insulating layer above respective donor atoms to control the strength of the hyperfine interactions between the donor electrons and the donor atoms' nuclear spins, and hence the resonance frequency of the nuclear spins of the donor atoms.

Conducting J-gates on the insulating layer between A-gates to turn on and off electron mediated coupling between the nuclear spins of adjacent donor atoms.

Where, the nuclear spins of the donor atoms are the quantum states or "qubits" in which binary information is stored and manipulated by selective application of voltage to the A- and J-gates and selective application of alternating magnetic field to the substrate.

A cooling means may be required to maintain the substrate cooled to a temperature sufficiently low, and a source of constant magnetic field having sufficient strength to break the two-fold spin degeneracy of the bound state of the electron at the donor may also be required. The combination of cooling and magnetic field may be required to ensure the electrons only occupy the nondegenerate lowest spin energy level.

The device may also incorporate a source of alternating magnetic field of sufficient force to flip the nuclear spin of donor atoms resonant with the field, and means may be provided to selectively apply the alternating magnetic field to the substrate.

In addition the device may include means to selectively apply voltage to the A-gates and J-gates.

The invention takes advantage of the fact that an electron is sensitive to externally applied electric fields. As a result the hyperfine interaction between an electron spin and the spin of the atomic nucleus, and the interaction between an electron and the nuclear spins of two atomic nuclei (that is electron mediated or indirect nuclear spin coupling) can be controlled electronically by voltages applied to gates on a semiconductor device in the presence of an alternating magnetic field. The invention uses these effects to externally manipulate the nuclear spin dynamics of donor atoms in a semiconductor for quantum computation.

In such a device the lifetime of the quantum states (or qubits) operated on during the computation must exceed the duration of the computation, otherwise the coherent state within the computer upon which quantum algorithms rely will be destroyed. The conditions required for electron-coupled nuclear spin computation and single nuclear spin detection can arise if the nuclear spin is located on a positively charged donor in a semiconductor host. The electron wave function is then concentrated at the donor nucleus (for s-orbitals and energy bands composed primarily of them), yielding a large hyperfine interaction energy. For shallow level donors, however, the electron wave function extends tens or hundreds of Å away from the donor nucleus, allowing electron-mediated nuclear spin coupling to occur over comparable distances.

An important requirement for a quantum computer is to isolate the qubits from any degrees of freedom that may interact with and "decohere" the qubits. If the qubits are spins on a donor in a semiconductor, then nuclear spins in the host are a large reservoir with which the donor spins can interact. Consequently, the host should contain only nuclei with spin I=0. This requirement eliminates all III–V semiconductors as host candidates, since none of their constituent elements possess stable I=0 isotopes. Group IV semiconductors are composed primarily of I=0 isotopes and may be purified to contain only I=0 isotopes. Because of the advanced state of Si materials technology and the tremendous effort currently underway in Si nanofabrication, Si is an attractive choice for the semiconductor host.

The only I=½ shallow (Group V) donor in Si is $^{31}$P. The Si:$^{31}$P system was exhaustively studied forty years ago by Feher in the first electron-nuclear double resonance experiments. At sufficiently low $^{31}$p concentrations at temperature T=1.5 K, Feher observed that the electron relaxation time was thousands of seconds and the $^{31}$P nuclear relaxation time exceeded 10 hours. At millikelvin temperatures the phonon limited $^{31}$P relaxation time may be of order $10^{18}$ seconds, making this system ideal for quantum computation.

The A- and J-gates may be formed from metallic strips patterned on the surface of the insulating layer. A step in the insulating layer over which the gates cross may serve to localise the gates electric fields in the vicinity of the donor atoms.

In operation the temperature of the quantum computer may be below 100 millikelvin (mK) and will typically be in the region of 50 mK. The process of quantum computation is non-dissipative, and consequently low temperatures can be maintained during computation with comparative ease. Dissipation will arise external to the computer from gate biasing and from eddy currents caused by the alternating magnetic field, and during polarisation and detection of nuclear spins at the beginning and end of the computation. These effects will determine the minimum operable temperature of the computer.

The constant magnetic field may be required to be of the order of 2 Tesla. Such powerful magnetic fields may be generated from superconductors.

The extreme temperatures and magnetic fields required impose some restrictions on the availability and portability of the quantum computing device outside of a laboratory. However, the high level of access to a computer situated remotely in a laboratory, for instance through use of the internet, may overcome any inconvenience arising from its remoteness. It is also feasible that the device could be utilised as a network server for personal computers, in which case the server may have a local cooling system and the personal computers may operate at room temperature.

The initial state of the computer must be accurately set and the result of the computation accurately measured. Electron devices may be provided to set the initial state and read output from the quantum computer. These devices polarize and measure nuclear spins. For example, the electron device may modulate the movement of a single electron, or a current of electrons, according to the state of a single nuclear spin. These devices will typically be provided at the edge of the array.

An electron device for polarizing and measuring nuclear spins may, comprise:

A semiconductor substrate into which at least one donor atom is introduced to produce a donor nuclear spin electron system having large electron wave functions at the nucleus of the donor atom.

An insulating layer above the substrate.

A conducting A-gate on the insulating layer above the donor atom to control the energy of the bound electron state at the donor.

A conducting E-gate on the insulating layer on either side of the A-gate to pull electrons into the vicinity of the donor.

Where in use, the gates are biased so that, if the transition is allowed, one or more electrons can interact with the donor state.

In a further aspect, the invention is a method of initializing the quantum computer, comprising the following steps:

biasing the gates so that, if the nuclear spin of a donor is in a first state no transition is allowed, but if the nuclear spin is in a second state transition is allowed, and one or more electrons can interact with the donor state to change the nuclear spin to the first state; and continuing the process until all the donors are in the first state.

In a further aspect, the invention is a method of measuring nuclear spins in the quantum computer, comprising the following steps:

biasing the gates so that, if the nuclear spin of a donor is in a first state no transition is allowed, but if the nuclear spin is in a second state transition is allowed, and one or more electrons can interact with the donor state to change the nuclear spin to the first state; and detecting the movement of the one or more electrons to determine the state of the respective donors.

BRIEF DESCRIPTION OF THE DRAWINGS

An example of the invention will now be described with reference to the accompanying drawings, in which:

FIG. 4 illustrates the effect on electron and nuclear spin energies when J coupling is turned on. In FIG. 4(*a*) the exchange interaction lowers the electron singlet energy with respect to the triplets. The computer is always operated when $J<\mu_B B/2$ so that the electron state is spin polarised. In FIG. 4(*b*) nuclear level splitting can be seen due to electron mediated interactions between the nuclei; the |10–01>–|10+01> splitting diverges (in second order perturbation theory) when $J=\mu_B B/2$.

FIG. 6(*a*) is a pictorial view of the arrangement When positively biased, E-gates pull electrons from ohmic contacts (not shown) into the vicinity of the edge qubit donor. FIG. 6(*b*) is a section showing the $^{31}P$ donor weakly coupled to 2 DEG's; if the transition is allowed, an electron can tunnel through the donor state. FIG. 6(*c*) illustrates the "spin diode" configuration, in which electron spin states at the Fermi level on opposite sides of the donor have opposite polarity. Resonant tunnelling from one side to the other will flip the nuclear spin on the donor, so that the nuclear spin is polarised by an electrical current. FIG. 6(*d*) illustrates the "single electron spin valve" configuration, in which electrons cannot tunnel onto the donor unless it can transfer its spin to the nucleus, resulting in a spin blockade if the electron and nuclear spins initially point in the same direction. An electron traversing across the donor must flip the nuclear spin twice, however, so the initial nuclear spin polarisation is preserved.

BEST MODES FOR CARRYING OUT THE INVENTION

Figure 1:
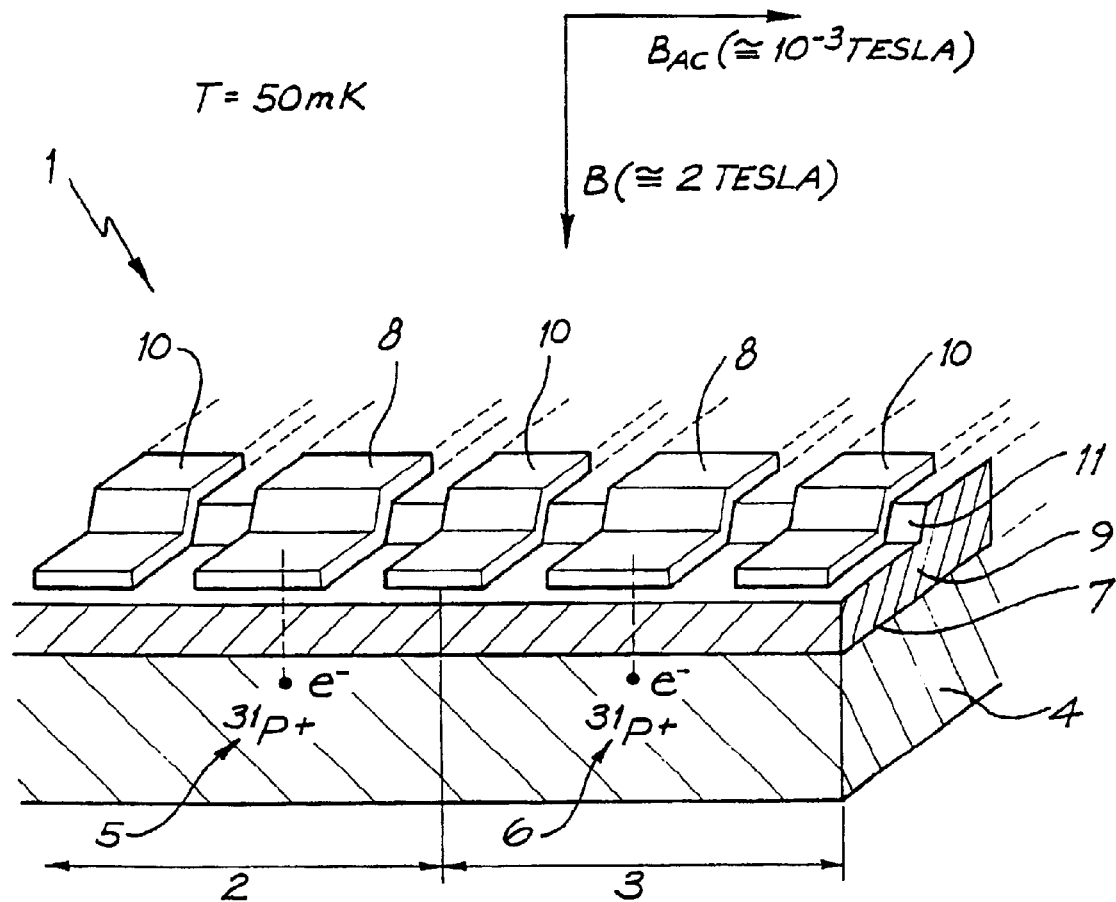
FIG. 1 illustrates two cells in a 1-Dimensional array containing $^{31}P$ donors and electrons in a Si host, separated by a barrier from metal gates on the surface. A-gates control the resonance frequency of the nuclear spin qubits, while J-gates control the electron-mediated coupling between adjacent nuclear spins. The ledge over which the gates cross localises the gate electric field in the vicinity of the donors.

Referring first to FIG. 1 (not to scale), a 1-Dimensional array 1 having two cells 2 and 3 comprises a Si substrate 4 into which two donor atoms 5 and 6 of $^{31}P$ are introduced 200 Å beneath the surface 7. There is one atom of $^{31}P$ in each cell and the atoms are separated by less than 200 Å. Conducting A-gates 8 are laid down on a $SiO_2$ insulating layer 9 above the Si substrate 4, each A-gate being directly above a respective $^{31}P$ atom. Conducting J-gates 10 are laid down on the insulating layer 9 between each cell 2 and 3. A step 11 over which the gates cross localises the gates electric fields in the vicinity of the donor atoms 5 and 6.

The nuclear spins of the donor atoms 5 and 6 are the quantum states or "qubits" in which binary information is stored and manipulated. The A-gates 8 control the resonance frequency of the nuclear spin qubits, while J-gates 10 control the electron-mediated coupling between adjacent nuclear spins.

In operation, the device is cooled to a temperature of T=50 mK. Also, a constant magnetic field of B=2T is applied to break the two-fold spin degeneracy. The combined effect is that the electrons only occupy the nondegenerate lowest spin energy level. The electrons must remain in a zero entropy ground state throughout a computation.

Magnitude of Spin Interactions in Si:$^{31}P$

The size of the interactions between spins determines both the time required to do elementary operations on the qubits and the separation necessary between donors in the array. The Hamiltonian for a nuclear spin-electron system in Si, applicable for an I=½ donor nucleus and with B°z is:

$$H_{en} = \mu_B B \sigma_z^e - g_n \mu_n B \sigma_z^n + A \sigma^e \cdot \sigma^n$$

where σ are the Pauli spin matrices (with eigenvalues ±1), $\mu_n$ is the nuclear magneton, $g_n$ is the nuclear g-factor (=1.13 for $^{31}$P), and $A = \frac{8}{3}\pi\mu_B g_n \mu_n |\Psi(0)|^2$ is the contact hyperfine interaction energy, with $|\Psi(0)|^2$ the probability density of the electron wave function evaluated at the nucleus. If the electron is in its ground state, the frequency separation of the nuclear levels is, to second order:

$$h\nu_A = 2g_n\mu_n B + 2A + \frac{2A^2}{\mu_B B} \qquad (2)$$

In Si:$^{31}$P, 2A/h=58 Mhz, and the second term in Equation (2) exceeds the first term for B<3.5 T.

Figure 2:
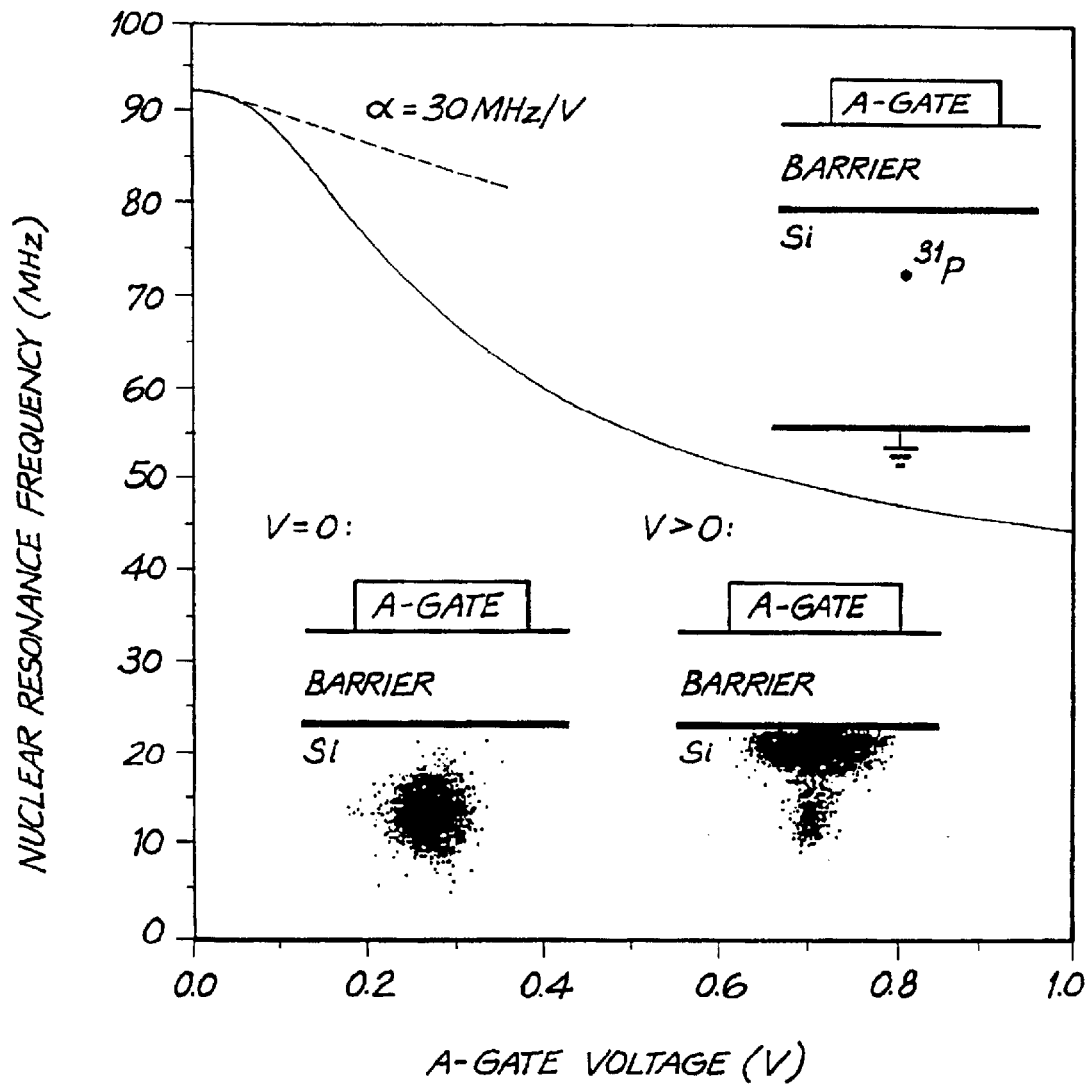
FIG. 2 illustrates how an electric field applied to an A-gate pulls the electron wave function away from the donor atom and toward the barrier, reducing the hyperfine interaction and the resonance frequency of the nucleus. The donor nuclear spin electron system acts as a voltage controlled oscillator.

An electric field applied at the A-gate to the electron-donor system shifts the electron wave function envelope away from the nucleus and reduces the hyperfine interaction. The size of this shallow donor Stark shift in Si, is shown in FIG. 2 for a donor 200 Å beneath a gate. A donor nuclear spin-electron system close to an A-gate functions as a voltage controlled oscillator: the precession frequency of the nuclear spin can be controlled externally, and spins can be selectively brought into resonance with an externally applied alternating magnetic field, $B_{AC}=10^{-3}$ T, allowing arbitrary rotations to be performed on the nuclear spin.

Figure 3:
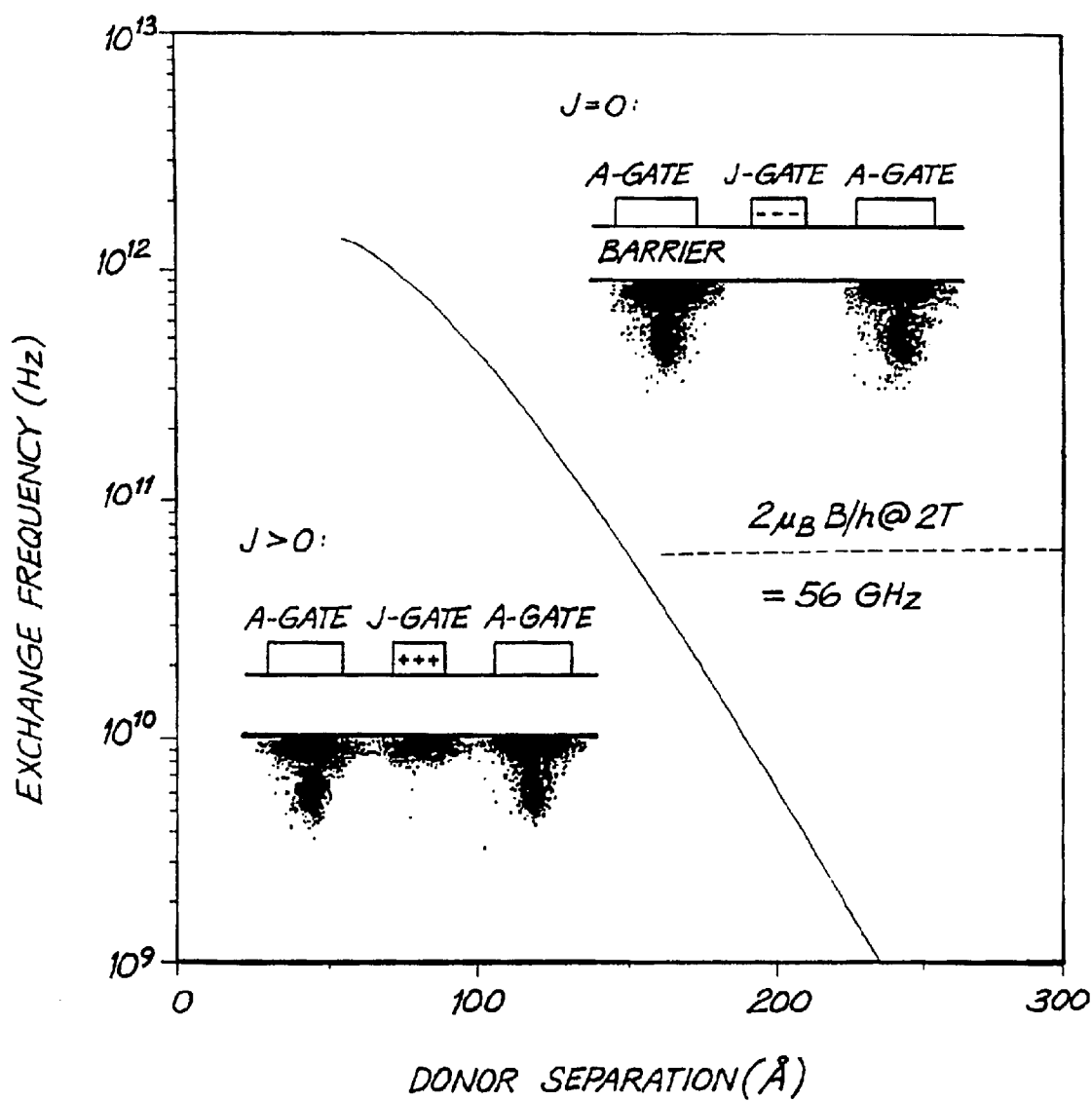
FIG. 3 illustrates how an electric field applied to a J-gate varies the electrostatic potential barrier V between the donors to enhance or reduce the exchange coupling, proportional to the electron wave function overlap. The exchange frequency (=4J/h) when V=0 is plotted for Si.

Quantum mechanical computation requires, in addition to single spin rotations, the two qubit "controlled rotation" operation, which rotates the spin of a target qubit through a prescribed angle if and only if the control qubit is oriented in a specified direction, and leaves the orientation of the control qubit unchanged. Performing such two spin operations requires coupling between two donor-electron spin systems, which will arise from the electron spin exchange interaction when the donors are sufficiently close to each other. The Hamiltonian of two coupled donor nuclei-electron systems is:

$$H = H(B) + A_1 \sigma^{1n} \cdot \sigma^{1e} + A_2 \sigma^{2n} \cdot \sigma^{2e} + J\sigma^{1e} \cdot \sigma^{2e} \qquad (3)$$

where H(B) are the magnetic field interaction terms for the spins. $A_1$ and $A_2$ are the hyperfine interaction energies of the nucleus-electron systems. 4J, the exchange energy, depends on the overlap of the electron wave functions. For well separated donors:

$$4J(r) \simeq 1.6 \frac{e^2}{\epsilon a_B} \left(\frac{r}{a_B}\right)^{\frac{5}{2}} \exp\left(\frac{-2r}{a_B}\right)$$

where r is the distance between donors $\in$ is the dielectric constant of the semiconductor, and $\alpha_B$ is the semiconductor Bohr radius. This function, with values appropriate for Si, is plotted in FIG. 3. Equation 4, originally derived for H atoms, is complicated in Si by its valley degenerate anisotropic band structure. Exchange coupling terms from each valley interfere, leading to oscillatory behaviour of J(r). In this example the complications introduced by Si band structure are neglected. In determining J(r) in FIG. 3, the transverse mass for Si($\simeq 0.2$ $m_e$) has been used, and $\alpha_B$=30 Å. As shall be seen below, significant coupling between nuclei will occur when $4J \approx \mu_B B$, and this condition determines the necessary separation between donors of 100–200 Å. Because J is proportional to the electron wave function overlap, it can be varied by an electrostatic potential imposed by a J-gate positioned between the donors.

Figure 4A:
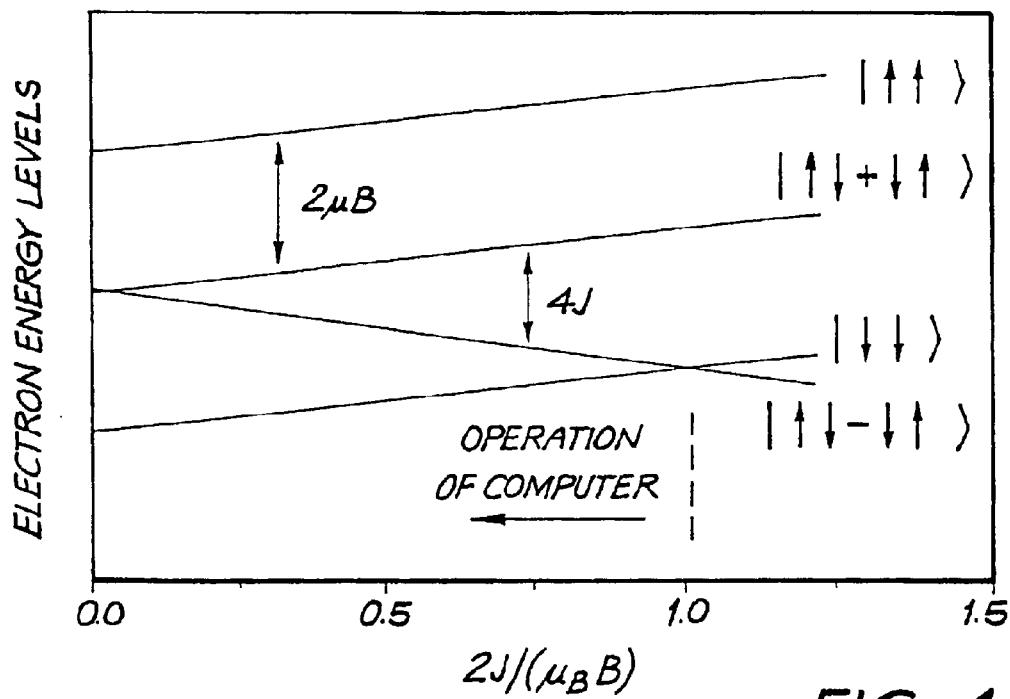

For two electron systems the exchange interaction lowers the electron singlet $(|\uparrow\downarrow - \downarrow\uparrow\rangle)$ energy with respect to the triplets. In a magnetic field, however, the electron ground state will be polarised if $\mu_B B > 2J$; see FIG. 4a. In the polarised ground state, the energies of the nuclear states can be calculated to second order in A using perturbation theory. The nuclear singlet (|10−01>) is lowered in energy with respect to (|10+01>) by:

$$h\nu_J = 2A^2 \left(\frac{1}{\mu_B B - 2J} - \frac{1}{\mu_B B}\right) \qquad (5)$$

Figure 4B:
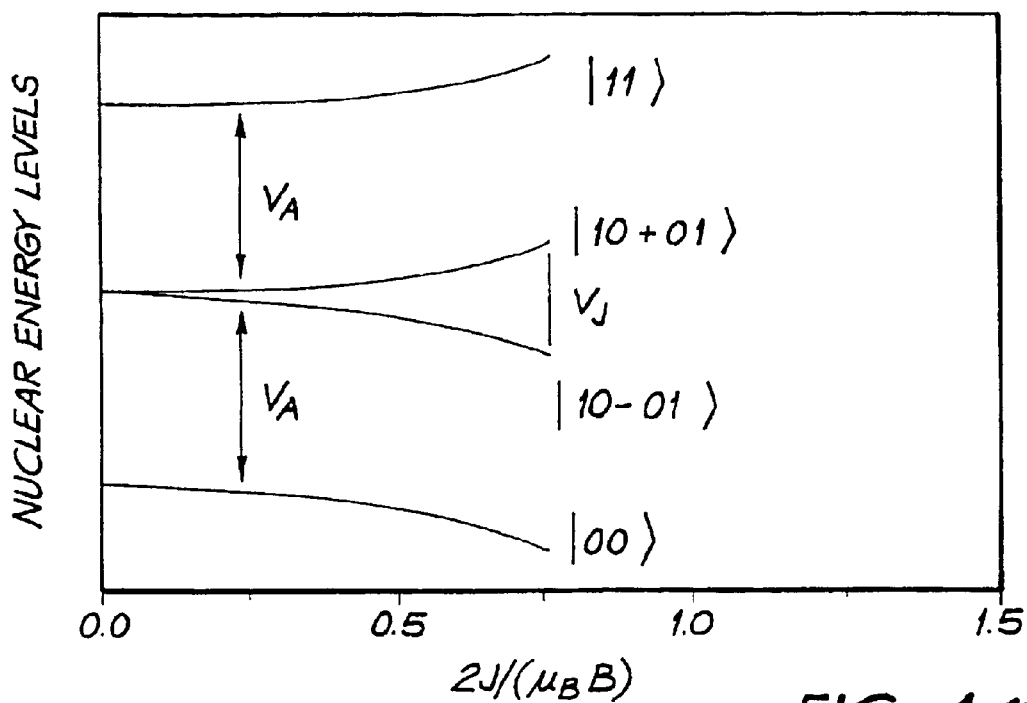

The other two triplet states are higher and lower than these states by $h\nu_A$, given in Equation 2; see FIG. 4b. For the Si:$^{31}$P system at B=2 Tesla and for 4J/h=30 Ghz, Equation 5 yields $\nu_j$=75 kHz. This frequency approximates the upper limit of the rate at which binary operations can be performed on the computer. The speed of single spin operations is determined by the size of $B_{AC}$ and is comparable to 75 kHz when $B_{AC}=10^{-3}$ Tesla.

Figure 5A:
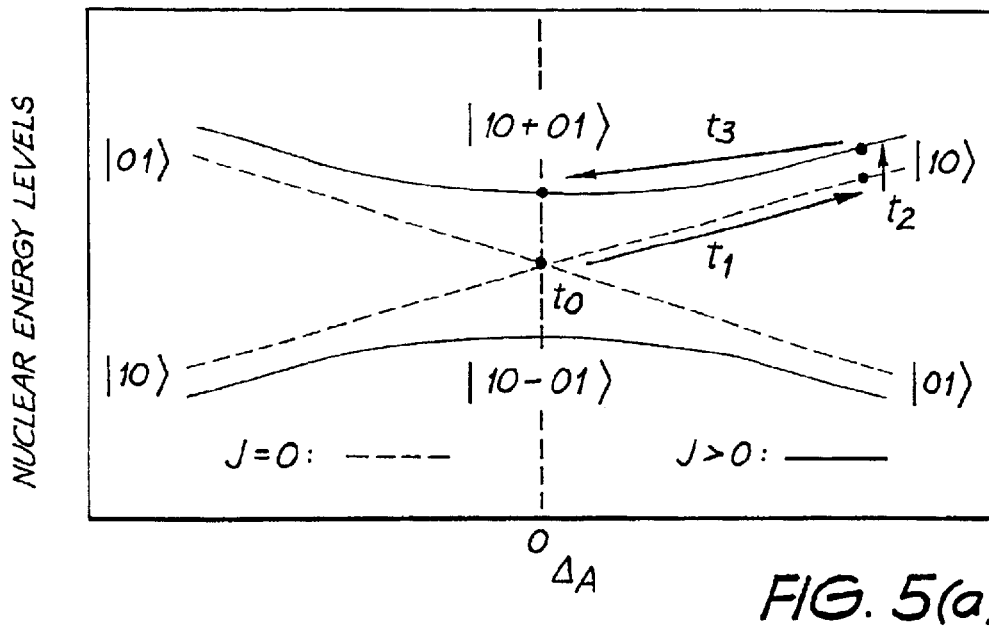
FIG. 5 (*a*), (*b*) and (*c*) illustrates a controlled NOT operation, realised by adiabatic variations in J, $\Delta_A$, and $B_{AC}$.

Equation 5 was derived for $A_1=A_2$. When $A_1 \neq A_2$ the nuclear spin singlets and triplets are no longer eigenstates, and the eigenstates of the central levels will approach |10> and |01> when $|A_1-A_2| >> h\nu_j$, as is characteristic of two level systems; see FIG. 5a.

Control of the J-gates, combined with control of A-gates and application of $B_{AC}$, are sufficient to effect the controlled rotation operation between two adjacent spins.

Figure 5B:
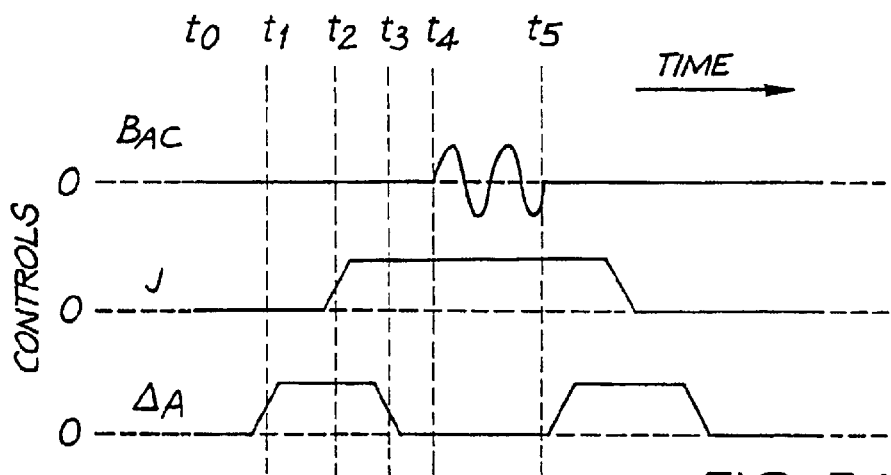
Figure 5C:
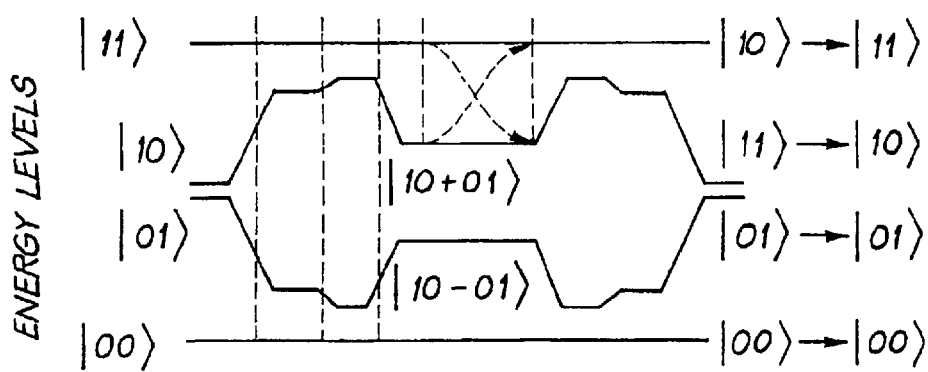

The controlled NOT operation (conditional rotation of the target spin by 180°) can be performed using an adiabatic procedure, in which the gate biases are swept slowly; refer to FIGS. 5b & c. At t=$t_0$, the two spin systems are uncoupled (J=0) and $A_1=A_2$ so that |10> and |01> are degenerate. At $t_1$ a differential voltage is applied to the A-gates (designated $\Delta_A$) that breaks this degeneracy. This symmetry breaking step distinguishes the control qubit from the target qubit. At $t_2$ exchange coupling between the spin systems is turned on, and at $t_3$ the $\Delta_A$ bias is removed. This sequence of steps adiabatically evolves |01> into |10−01> and |10> into |10+01>. At $t_4$ $B_{AC}$ is applied resonant with the |10+01>−|11> energy gap. Although to lowest order in perturbation theory, $B_{AC}$ will also be resonant with the |00>−|10−01> gap, the matrix element of this second transition is zero since the singlet state is not coupled to the other states by $B_{AC}$.

$B_{AC}$ is left on until $t_5$, when it has transformed |11> into |10+01> and vice versa. The |10−01> and |10+01> are then adiabatically transformed back into |10> and |01> in a reverse of the sequence of steps performed at the beginning of the operation. The qubit whose resonance energy was increased by the action of $\Delta_A$ at the outset is unchanged, while the state whose energy was decreased is inverted if and only if the other qubit is |1>. The controlled NOT operation has been performed. Arbitrary controlled rotations can be accomplished by appropriately setting the duration and frequency of $B_{AC}$.

It is likely that computational steps can be performed more efficiently than the adiabatic approach discussed above allows. In particular, the EXCHANGE operation (in which adjacent qubits are simply swapped with one another, the only way the qubits can be moved around in a quantum computer) can be effected by turning on a J-gate when $\Delta_A$=0 for a period=$\nu_f^{-1}/2$. Also, $B_{AC}$ can be continuously on and the qubits brought into resonance with it during the controlled NOT operation by varying $A_1+A_2=\Sigma_A$ of the coupled spins. This approach enables unary and binary operations to be performed on qubits throughout the computer simultaneously, with the nature of the operation on each qubit determined entirely by the individual A-gate and J-gate biases.

Spin Decoherence Introduced by Gates

In the quantum computer architecture outlined above, biasing of A-gates and J-gates enables custom control of the qubits and their mutual interactions. The presence of the gates, however, will lead to decoherence of the spins if the gate biases fluctuate away from their desired values. The largest source of decoherence is likely to rise from voltage fluctuations on the A-gates. The precession frequencies of two spins in phase at t=0 depends on the potentials on their respective A-gates, Differential fluctuations of the potentials produce differences in the precession frequency. At some later time $t=t_\phi$ the spins will be 180° out of phase. $t_\phi$ can be estimated by determining the transition rate between $|10+01\rangle$ (spins in phase) and $|10-01\rangle$ (spins 180° out of phase) of a two spin system. The Hamiltonian that couples these states is:

$$H_\phi = \frac{1}{4} h \Delta (\sigma_2^{1n} - \sigma_2^{2n}) \quad (6)$$

where $\Delta$ is the fluctuating differential precession frequency of the spins. Standard treatment of fluctuating Hamiltonians predicts: $t_\phi^{-1} = \pi^2 S_\Delta (v_{st})$, where $S_\Delta$ is the spectral density of the frequency fluctuations, and $v_{st}$ is the frequency difference between the $|10-01\rangle$ and $|10+01\rangle$ states. At a particular bias voltage, the A-gates have a frequency tuning parameter $\alpha = d\Delta/dV$. Thus:

$$t_\phi^{-1} = \pi^2 \alpha^2 (V) S_V (v_{st}), \quad (7)$$

where $S_V$ is the spectral density of the gate bias potential fluctuations.

$S_V$ for good room temperature electronics is of order $10^{-18} V^2/Hz$, comparable to the room temperature Johnson noise of a 50$\Omega$ resistor, $\alpha$, estimated from FIG. 2, is 10–100 MHz/Volt, yielding $t_\phi = 10-1000$ sec. $\alpha$ is determined by the size of the donor array cells and cannot readily be reduced (to increase $t_\phi$) without reducing the exchange interaction between cells. Because $\alpha$ is a function of the gate bias (see FIG. 2) $t_\phi$ can be increased by minimising the voltage applied to the A-gates.

While Equation 7 is valid for white noise, at low frequencies it is likely that materials dependent fluctuations (1/f noise) will be the dominant cause of spin dephasing. Consequently, it is difficult to give hard estimates of $t_\phi$ for the computer. A particular source of low frequency fluctuations, alluded to above, arises from nuclear spins in the semiconductor host. This source of spin dephasing can be eliminated by using only I=0 isotopes in the semiconductor and barrier layers. Charge fluctuations within the computer (arising from fluctuating occupancies of traps and surface states, for example) are likely to be particularly important, and minimising them will place great demands on computer fabrication.

While material dependent fluctuations are difficult to estimate, the low temperature operation of the computer and the dissipationless nature of quantum computing mean that in principle fluctuations can be kept extremely small: using low temperature electronics to bias the gates could produce $t_\phi \approx 10^6$ sec. Electronically controlled nuclear spin quantum computers thus have the theoretical capability to perform at least $10^5$ to perhaps $10^{10}$ logical operations during $t_\phi$, a critical requirement for performing complex calculations on large numbers of qubits.

Spin Initialisation and Measurement

The action of A-gates and J-gates, together with $B_{AC}$ perform all of the reversible operations for quantum computation. The qubits must also be properly initialised and measured.

Figure 6A:
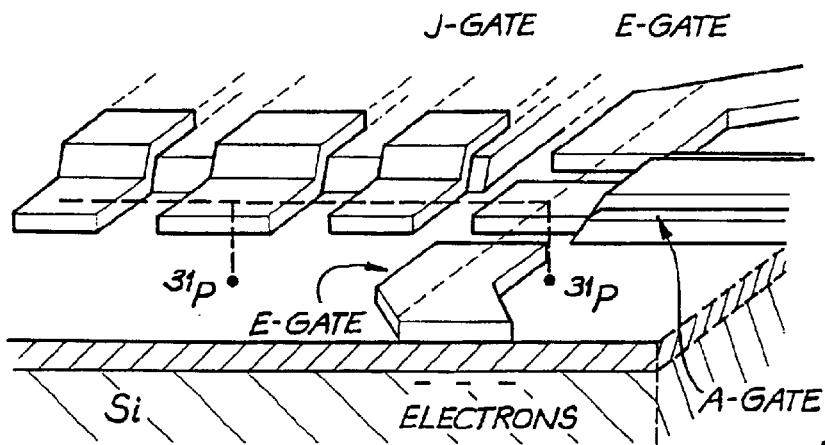
FIG. 6 illustrates a configuration at the edge of the array for polarising and detecting nuclear spins.
Figure 6B:
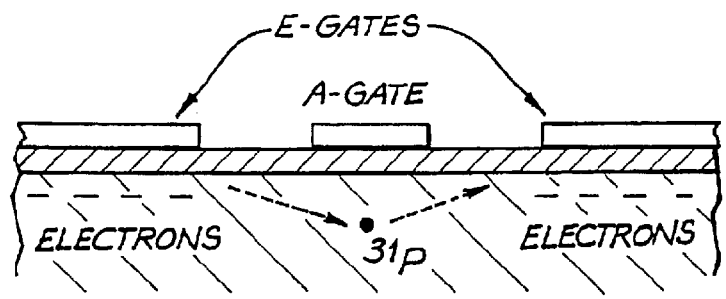

To accomplish these tasks in the proposed computer, qubits at the edge of the array are weakly coupled to two dimensional electron gases (2 DEG's) that are confined to the barrier-Si interface by a positive potential on E-gates (a field effect transistor in enhancement mode); see FIG. 6a. The nuclear spin qubit is probed by an electron tunnelling through a bound state at the donor; see FIG. 6b. When B≠0 the electron energy levels are discrete and electron spin levels are split by $2 \mu_B B$. When the Landau level filling factor v<1, the electron spins are completely polarised at low temperature. When v>1, however, electrons must occupy the higher 10 energy spin level and states at the Fermi level ($E_F$) are polarised in the opposite direction than for v<1 (For simplicity, neglecting the valley degeneracy of the electrons in Si. Also, many body "skyrmion" effects that can reduce the electron spin polarisation are small in Si and are also neglected).

Figure 6C:
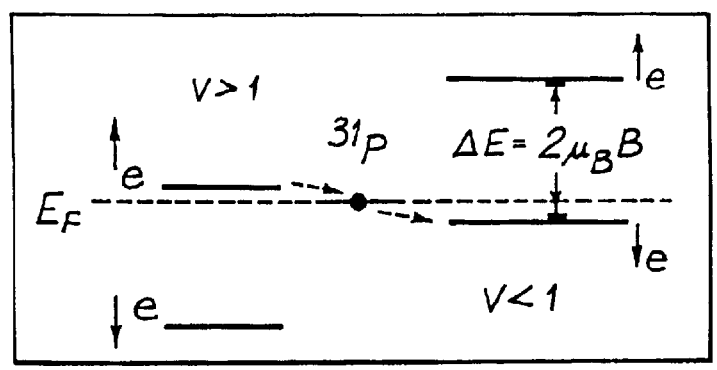

A junction between a v<1 region and a v>1 region is a "spin diode", so called because of the analogy between electron spin splitting in these devices and the band gap in a semiconductor p-n junction diode; see FIG. 6c. Spin diodes are created by biasing the two E-gates at different voltages that produce different densities in each 2 DEG. The large energy difference between electron and nuclear spin flip energies usually impedes spin transfer, but the electric field in the spin diode junction enables $|\uparrow\rangle$ and $|\downarrow\rangle$ states of the electron with the same energy to overlap, enabling resonant electron-nuclear spin exchange. The nucleus in the junction can thus be polarised rapidly by a current through the junction. $|0\rangle$ qubit states created in this way at the edges of the donor array can be transferred throughout the array by the EXCHANGE operation. $|0\rangle$'s can be converted into $|1\rangle$'s with selective unary NOT operations to complete the initialisation procedure.

Fluctuations from cell to cell in the gate biases necessary to perform logical operations are an inevitable consequence of variations in the positions of the donors and in the sizes of the gates. The parameters of each cell, however, can be determined individually using the measurement capabilities of the computer, because the measurement technique discussed here does not require precise knowledge of the J and A couplings. The A-gate voltage at which the underlying nuclear spin is resonant with an applied $B_{ac}$ can be determined using the technique of adiabatic fast passage: when $B_{ac}=0$, the nuclear spin is measured and the A-gate is biased at a voltage known to be off resonance. $B_{ac}$ is then switched on, and the A-gate bias is swept through a prescribed voltage interval. $B_{ac}$ is then switched off and the nuclear spin is measured again. The spin will have flipped if, and only if, resonance occurred within the prescribed A-gate voltage range. Testing for spin flips in increasingly small voltage ranges leads to the determination of the resonance voltage. Once adjacent A-gates have been calibrated, the J-gates can be calibrated in a similar manner by sweeping J-gate biases across resonances of two coupled cells.

Instead of using the EXCHANGE operation, the calibration procedure 10 can be performed in parallel on many cells, and the calibration voltages can be stored on capacitors located on the Si chip adjacent to the quantum computer to initialize it. Calibration is not a fundamental impediment to scaling the computer to large sizes, and external controlling circuitry would thus need to control only the timing of gate biases, and not their magnitudes.

Readout of the nuclear spin state can be performed simply by reversing the loading process. Since electrons can only traverse a spin diode junction by exchanging spin with a nucleus (say, by converting $|1\rangle$ into $|0\rangle$) a "spin blockade"

will result if the nuclear spin is |0>. If the nuclear state is |1>, a single electron can cross the junction, simultaneously flipping the nucleus from |1> to |0>.

Because a |1> state is converted to a single electron crossing the junction, this detection technique requires extremely sensitive single electron sensing circuitry. It would be preferable to have a conductance modulation technique to sense the nuclear spin. If large numbers of electrons can interact with the nuclear spin without depolarising it, many separate effective measurements could be made of the spin.

Figure 6D:
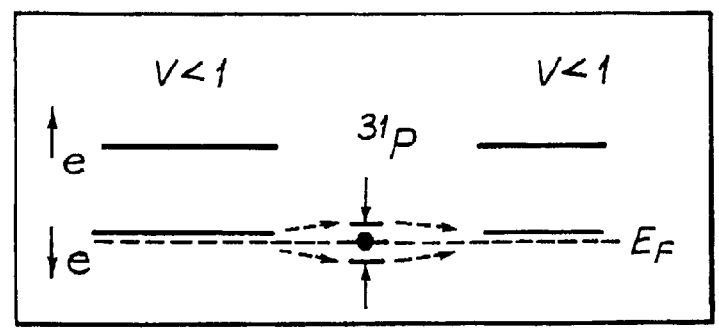

One possibility is the "single electron spin valve" configuration shown in FIG. 6d. The E-gates are biased so that only |↓> electrons are present on both sides of the output cell. The A-gate of the output cell is biased so that $E_F$ lies at the energy of the two electron bound states at the donor (the D⁻ state). In Si:$^{31}$ P at B=2 Tesla this state is a singlet, and the second electron binding energy is 1.7 meV, about seven times greater than the spin level splitting. In a single electron spin valve an electron can tunnel on or off of the D⁻ state by a mutual electron-nuclear spin flip only if the nuclear and electron spins are oppositely polarised. A current flow across the donor requires two successive spin flips as the electron tunnels in and out of the D⁻state, consequently, a current across the donor preserves the nuclear spin polarisation. Current flow across the single electron spin valve is turned on or off depending on the orientation of the nuclear spin on the donor.

The rate of electron transmission across a single electron spin valve can potentially be comparable to the hyperfine interaction frequency: 60 MHz in Si:$^{31}$ P, or I=10 pA. In actual devices a background current of electrons tunnelling through channels that do not flip the nuclear spin will inevitably be present. Dipolar spin interactions (generally much weaker that the contact hyperfine interaction) can flip a single nuclear spin without an accompanying electron spin flip, and will limit the number of electrons that can probe the nuclear spin before it is depolarised. Optimised devices will maximise the ratio of the number of electrons that can probe the nucleus to the background. Prototype single electron spin valve devices can be tested using single electron capacitance probes of donor states with nonzero nuclear spin.

Constructing the Computer

The materials used to build such a computer must be almost completely free of spin (I=/0 isotopes) and charge impurities in order to prevent dephasing fluctuations from arising within the computer. Donors must be introduced into the material in an ordered array hundreds of Å beneath the surface. Finally, the gates with lateral dimensions and separations <100 Å must be patterned on the surface, registered to the donors beneath them. Each of these are the focus of intense current research in the rapidly moving field of semiconductor growth and nanofabrication. This research bears directly on the problems of making a nuclear spin quantum computer in silicon.

An excellent indicator of suitable semiconductor materials for use in a quantum computer is the ability to observe the integral and fractional quantum Hall effects in them. In particular, the spin detection techniques outlined above require that electrons can be fully spin polarised, a condition which leads to quantisation of the Hall effect at integers corresponding to the spin gap. This condition is well satisfied in high mobility GaAs/Al$_x$Ga$_{1-x}$As heterostructures, where nuclear spin sensing electronics have been demonstrated. Absence of I=0 isotopes, however, in these materials means that making a quantum computer from them is highly unlikely. Recent advances in Si/Si$_x$Ge$_{1-x}$ heterostructures have led to materials composed entirely of group IV elements with quality comparable to GaAs heterostructures. The fractional quantum Hall effect is observed in these materials and spin splitting is well resolved. Nanostructures have also been fabricated on high quality Si/Si$_x$Ge$_{1-x}$ heterostructures.

While the quality of Si/SiO$_2$ interfaces and the electron systems confined there is less than that of epitaxial interfaces, spin splittings are well resolved at low temperatures. The much larger barrier height in SiO$_2$ over Si/Si$_x$Ge$_{1-x}$(3.3V vs. ~0.2 V) is a critical advantage in nanostructures with sizes of 100 Å or less. Leakage of electrons across the barrier material, resulting in the removal of an electron from a donor state, is a source of decoherence in the quantum computer not mentioned previously. Electrons consequently must not tunnel across the barrier during the computation. Also, the ability of J-gates to vary the exchange interaction over a large dynamic range will improve in devices with large barrier heights. Technologies being developed for electronics applications may result in structures with both the high interface quality of Si/Si$_x$Ge$_{1-x}$ and the larger tunnel barrier of SiO$_2$. Because of charge fluctuations and disorder, it is likely that bulk and interface states in SiO$_2$ will need to be reduced or eliminated if a quantum computer is to be fabricated using SiO$_2$.

The most obvious obstacle to building the quantum computer presented above is the incorporation of the donor array into the Si layer beneath the barrier layer. Currently semiconductor heterostructures are deposited layer by layer. The δ-doping technique produces donors lying on a plane in the material, with the donors randomly distributed within the plane. The quantum computer envisioned requires that the donors be placed into an ordered 1D or 2D array; furthermore, precisely one donor must be placed into each array cell, making it extremely difficult to create the array by using lithography and ion implantation or by focused deposition. Methods currently under development to place single atoms on surfaces using ultra high vacuum scanning tunnelling microscopy are likely candidates to be used to position the donor array. This approach has been used to place Ga atoms on a Si surface. A challenge will be to grow high quality Si layers on the surface subsequent to placement of the donors.

Because the donors in the array must be <200 Å apart in order for exchange coupling between the electron spins to be significant, the gate dimensions must be <100 Å. In addition, the gates must be accurately registered to the donors beneath them. Scanned probe lithography techniques have the potential to sense the location of the donors beneath the surface prior to exposing the gate patterns on the surface. For example, a scanning near field optical microscope could be used to detect the photoluminescence characteristic of the P donors in a wavelength range that does not expose photoresist. After P detection and proper positioning of the probe, the resist is exposed with a different light wavelength. "Custom patterning" of the gates may prove to be necessary to compensate for irregularities or defects in the placement of the donor array.

Probably the most attractive aspect of an Si based quantum computer is that many of the technical challenges facing its development are similar to those facing the next generation of conventional electronics; consequently, tremendous efforts are already underway to overcome these obstacles. This commonality raises the hope that the difficult task of making large 2D arrays of qubit cells will one day be accomplished using conventional Si electronics technology.

A particular problem with scaling of the computer presented here is that inevitable differences at the atomic level between qubit cells means that the appropriate biases to apply to gates during quantum computation will differ from cell to cell. Scaling the computer to large numbers of qubits will consequently require an equally large number of connections to external electronics to enable custom gate biasing. It is still possible that nontrivial quantum calculations (say on the $10^3$–$10^4$ qubits necessary for quantum computers to exceed the capability of conventional computers in solving the prime factorisation problem) could be performed by doing logical operations on only a few qubits at a time and addressing each gate separately using conventional FET multiplexing circuitry located adjacent to the quantum computer. This approach greatly simplifies the design and operation of the computer at the expense of foregoing its capability to perform many quantum logical operations in parallel.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A quantum computer, including:
   a semiconductor substrate into which donor atoms are introduced to produce an array of donor nuclear spin electron systems having large electron wave functions at the nucleus of the donor atoms, where the donor electrons only occupy the nondegenerate lowest spin energy level;
   an insulating layer above the substrate;
   conducting A-gates on the insulating layer above respective donor atoms to control the strength of the hyperfine interactions between the donated electrons and the donor atoms' nuclear spins, and hence the resonance frequency of the nuclear spins of the donor atoms;
   conducting J-gates on the insulating layer between A-gates to turn on and off electron mediated coupling between the nuclear spins of adjacent donor atoms;
   where, the nuclear spins of the donor atoms are the quantum states or "qubits" in which binary information is stored and manipulated by selective application of voltage to the A- and J-gates and selective application of an alternating magnetic field to the substrate.

2. A quantum computer according to claim 1, where the nuclear spin is located on a positively charged donor in a semiconductor host.

3. A quantum computer according to claim 2, where the host contains only nuclei with spin I=0.

4. A quantum computer according to claim 3, where the host contains only Group IV semiconductors composed of I=0 isotopes or purified to contain only I=0 isotopes.

5. A quantum computer according to claim 4, where Si is the semiconductor host.

6. A quantum computer according to claim 5, where Si:$^{31}$P is the host-donor system.

7. A quantum computer according to any preceding claim, where the A and J-gates are formed from metallic strips patterned on the surface of the insulating layer.

8. A quantum computer according to claim 7, where there is a step in the insulating layer over which the gates cross to localise the gates electric fields in the vicinity of the donor atoms.

9. A quantum computer according to claim 1, including means to selectively apply voltage to the A-gates and J-gates.

10. A quantum computer according to claim 1, including a cooling means to maintain the substrate cooled.

11. A quantum computer according to claim 10, where in operation the temperature of the device is below 100 millikelvin (mK).

12. A quantum computer according to claim 11, where in operation the temperature of the device is about 50 mK.

13. A quantum computer according to claim 1, including a source of constant magnetic field having sufficient strength to break the two-fold spin degeneracy of the bound state of the electron at the donor.

14. A quantum computer according to claim 13, where the constant magnetic field is of the order of 2 Tesla.

15. A quantum computer according to claim 14, where the constant magnetic field is generated from superconductors.

16. A quantum computer according to claim 1, including a cooling means to maintain the substrate cooled and a source of constant magnetic field having sufficient strength to break the two-fold spin degeneracy of the bound state of the electron at the donor where the combination of cooling and constant magnetic field ensures the electrons only occupy the nondegenerate lowest spin energy level.

17. A quantum computer according to claim 1, where the device also incorporates a source of alternating nagnetic filed of sufficient force to flip the nuclear spin of donor atoms resonant with the field, and means to selectively apply the alternating magnetic field to the substrate.

18. A quantum computer according to claim 1, including electron devices which polarize and measure nuclear spins to set the initial state or to read output from the quantum computer, or both.

19. A quantum computer according to claim 18, where the electron devices operate such that a single nuclear spin modulates a current of electrons.

20. A quantum computer according to claim 18 or 19, where the electron devices are provided at the edge of the array.

21. A quantum computer according to claim 18, where each electron device comprises:
    a semiconductor substrate into which at least one donor atom is introduced to produce a donor nuclear spin electron system having large electron wave functions at the nucleus of the donor atom;
    an insulating layer above the substrate;
    a conducting A-gate on the insulating layer above the donor atom to control the strength of the hyperfine interaction between the donated electron and the donor atom's nuclear spin; and
    a conducting E-gate on the insulating layer on either side of the A-gate to pull electrons into the vicinity of the donor.

22. A method of initializing the quantum computer according to claim 1, comprising the following steps:
    biasing the gates to cause the nuclear spin of all the donor atoms to adopt the same state.

23. A method of initializing the quantum computer according to claim 1, comprising the following steps:
    biasing the gates; and
    detecting whether there is movement of electrons associated with each donor atom to determine the state of the respective donors.

* * * * *